United States Patent [19]

MacIver et al.

[11] Patent Number: 4,769,685

[45] Date of Patent: Sep. 6, 1988

[54] RECESSED-GATE JUNCTION-MOS FIELD EFFECT TRANSISTOR

[75] Inventors: Bernard A. MacIver, Lathrup Village; James C. Erskine, Birmingham, both of Mich.

[73] Assignee: General Motors Corporation, Detroit, Mich.

[21] Appl. No.: 923,583

[22] Filed: Oct. 27, 1986

[51] Int. Cl.[4] .................. H01L 29/78; H01L 29/50; H01L 29/06; H01L 27/02
[52] U.S. Cl. .................. 357/23.4; 357/23.1; 357/23.7; 357/23.12; 357/23.14; 357/22; 357/55; 357/41
[58] Field of Search .............. 357/23.14, 23.12, 23.1, 357/23.4, 23.7, 22, 55, 41

[56] References Cited

U.S. PATENT DOCUMENTS

| | | | |
|---|---|---|---|
| 3,508,123 | 4/1970 | Liles | 317/234 |
| 3,624,895 | 12/1971 | MacIver et al. | 29/570 |
| 3,648,340 | 3/1972 | MacIver | 29/25.42 |
| 3,678,347 | 7/1972 | Tulp et al. | 317/235 R |
| 3,877,053 | 4/1975 | Kaplit | 357/23 |
| 4,141,021 | 2/1979 | Decker | 357/22 |
| 4,463,366 | 7/1984 | Ishii et al. | 357/22 |
| 4,546,367 | 10/1985 | Schutten et al. | 357/23.14 |
| 4,574,207 | 3/1986 | Benjamin et al. | 357/23.14 |
| 4,611,220 | 9/1986 | MacIver | 357/23.7 |

FOREIGN PATENT DOCUMENTS

| | | | |
|---|---|---|---|
| 42522 | 12/1981 | European Pat. Off. | 357/23 TF |
| 2045177 | 3/1972 | Fed. Rep. of Germany | 357/23 R |
| 47-3213 | 1/1972 | Japan | 357/23 R |

OTHER PUBLICATIONS

"J-MOS: A Versatile Power FET", by MacIver et al., p. 154, IEEE Electron Device Letters, vol. EDL-5, No. 5, May '84.
"A New Vertical . . . On-Resistance", by Ueda et al., IEEE Electron Device Letters, ED-32, No. 1, pp. 1-5, Jan. 1985.
Ueda et al., "A New Vertical Power MOSFET Structure with Extremely Reduced On-Resistance", IEEE Trans. Electron Devices, vol. ED-32, No. 1, pp. 1-5, Jan. 1985.
B. A. MacIver and K. C. Jain, IEEE Electron Device Letters, EDL-5, No. 5, May 1984, p. 154.
S. M. Sze, Physics of Semiconductor Devices, pp. 314-322, 2nd edition, John Wiley & Sons, Inc., New York, New York, 1981.
M. Akiya, K. Ohwada and S. Nakashima, "High-Voltage Buried-Channel MOS Fabricated by Oxygen Implantation into Silicon," Electronics Letters, v 17, n 18, pp. 605-611 (3 Sep. 1981).
S. R. Hofstein, "An Analysis of Deep Depletion Thin-Film MOS Transistors," IEEE Transactions on Electron Devices, v ED-13, n 12, pp. 846-855.
Editorial, "IC Techniques Boost Power-FET Current," Electronic Times, p. 1 (21 Dec. 1981).

*Primary Examiner*—William D. Larkins
*Assistant Examiner*—David R. Josephs
*Attorney, Agent, or Firm*—Robert J. Wallace

[57] ABSTRACT

An insulated gate field effect transistor of the depletion mode type has a recessed gate structure with opposed gate sections on opposite sides of adjacent bar-like structures defined in a channel region. An opposite conductivity-type island in the channel region is electrically connected to the transistor gate electrode. A voltage applied to the gate electrode generates an electric field effect which extends from the opposed gate sections into said bar-like structures creating opposed depletion regions which modulate channel current. The gate voltage simultaneously biases the island to enhance the gate electric field effect by removing minority charge carriers which would otherwise accumulate in the bar-like structures.

19 Claims, 2 Drawing Sheets

RECESSED-GATE JUNCTION-MOS FIELD EFFECT TRANSISTOR

TECHNICAL FIELD

The present invention generally relates to insulated gate field effect transistors, commonly referred to as IGFETs. More specifically, this invention relates to depletion mode IGFETs.

BACKGROUND ART

Insulated gate field effect transistors are current-controlling, microelectronic devices constructed primarily of semiconductive thin films to which dopant impurities are added at designated device regions. These doped regions include a source region, a drain region, and a channel region. An electrical potential applied across the source and drain regions generates a current which flows through the channel when the device is in the "on" state. The current between the source and drain is modulated by controlling the channel resistance.

Generally, IGFETs can be divided into enhancement mode and depletion mode devices. In both enhancement and depletion mode IGFETs, channel resistance is controlled by an externally applied electric field provided by an insulated gate electrode. The gate electrode is positioned such that it produces an electric field perpendicular to the flow of current through the device channel. In an enhancement mode IGFET, a layer of semiconductive material disposed between the source and drain is doped with impurities to form a region of high resistance. The device is "normally-off" or current blocking at zero gate voltage. In this state, the resistance of the semiconductor material interadjacent the source and drain is sufficiently large such that no drain current flows. When a potential of appropriate polarity is applied to the gate electrode, free majority charge carriers are drawn toward the gate to form an inversion layer in the device channel at the interface of the channel and the gate insulator. In the inversion layer, the charge carriers are the same type as in the source and drain, so they create a highly conductive channel electrically linking the source and drain. This is the on-state in an enhancement mode device, in which the field induced channel allows a drain current to flow.

In the channel region of a depletion mode IGFET, the semiconductor material disposed between source and drain is doped with impurities to produce a lower resistance, "normally-on" channel through which working current can flow with no voltage applied to the gate. By biasing the gate electrode appropriately, a gate field is produced which extends through the gate insulator and into the channel. The gate field repels majority charge carriers, creating a space charge depletion region in the channel. Increasing the gate voltage increases the region of charge carrier depletion which in turn raises the channel resistance. When the depletion region extends completely across the channel, the current between the source and drain is blocked by the channel resistance. This is the "off-state". The gate voltage required to turn off a depletion mode IGFET is commonly referred to as the "pinchoff" voltage.

IGFETs have received renewed interest recently for use as power transistors. By decreasing channel resistance, depletion mode IGFETs can be manufactured which conduct relatively high currents.

One such high-power depletion mode IGFET, referred to as a "J-MOS" transistor, is disclosed in U.S. patent application Ser. No. 552,409 filed Nov. 16, 1983, now U.S. Pat. No. 4,611,220, filed in the name of B. A. MacIver. The J-MOS is constructed on an insulating substrate such as sapphire or silicon dioxide. In a vertically arranged embodiment, the insulator is buried in a semiconductive film, portions of which comprise the source, channel and drain. Utilizing the J-MOS design, IGFETs with highly conductive channels can be turned off. This is made possible by the addition of a novel, island-like pn junction located at the channel gate insulator interface. A voltage applied to the gate to deplete the channel of majority charge carriers simultaneously places the island-like pn junction in reverse bias. Prior to the J-MOS design, the large gate voltages needed to pinch off current through highly conductive channels caused unwanted thermal generation of minority carriers which accumulated beneath the gate insulator. These minority carriers created an inversion layer or electrostatic shield between the gate and the channel which precluded complete channel depletion. The reverse biased J-MOS pn channel junction eliminates this inversion layer by acting as a sink for thermally generated minority carriers. The J-MOS design therefore allows high-power IGFETs to be controlled over their full dynamic range.

However, the J-MOS transistor design described above requires a bulk semiconductive film disposed on an insulator or, alternatively, incorporates an insulator within the film. As those skilled in the art will appreciate, semiconductor-on-insulator devices are costly to manufacture due to fabrication complexity and the utilization of expensive insulators such as sapphire. Therefore, it would be desirable to design a J-MOS transistor-type device which does not require an insulative substrate or buried insulator. We have devised such a device.

SUMMARY OF THE INVENTION

It is an object of the present invention to provide an insulated gate field effect transistor of the depletion mode which has a highly conductive channel that can be sufficiently depleted of majority charge carriers such that the current flowing between the source and drain can be turned off, and which is constructed without using an insulative channel substrate or a buried insulator.

It is a further object of this invention to provide such a power IGFET which has high packing density.

We have discovered how to make a high packing density, power-switching depletion mode IGFET which does not have an insulative substrate or buried insulator. We refer to our invention as a "recessed-gate J-MOS transistor" and it can be used in the future to more efficiently switch higher electrical currents.

In substance, we incorporate one or more small islandlike pn junctions in the channel of an IGFET and arrange the semiconductive device regions such that the channel resistance can be controlled by a pair of electric fields produced at opposed sections of a recessed gate structure. Our invention provides a low-cost, high packing density, power-switching IGFET.

Our invention includes a semiconductive film having an upper surface with designated regions of preselected impurity concentrations. The lower portion of the film is a heavily doped drain region to which a metallized drain terminal makes ohmic contact. Lying immediately above the drain region and coextensive therewith, a channel layer is disposed having the same conductivity type as that of the drain region, but of higher resistivity than the drain region. Integral portions of the channel layer project upwardly to the principal film surface and extend laterally across the film. The ends of the channel portions are spaced slightly away from the film perimeter and can be viewed as bars of a grid extending between side portions of the channel layer or as rectangular strips extending partially across the principal film surface. Heavily doped source regions of the same conductivity type as that of the drain and channel regions are disposed in the uppermost region of each bar-like channel portion. Positioned on each side of the bar-like structures are recessed segments of a gate electrode and an underlying recessed layer of gate insulator which are folded into longitudinal U-shaped grooves in the principal film surface. Opposed sections of the insulated gate segments are disposed on each side of every bar structure and are coextensive therewith such that the source-to-drain current flows vertically between these opposed gate electrode sections.

Along the side portions of the channel layer at the principal film surface, small island-like regions of conductivity type opposite that of channel region are formed which are in electrical contact with the gate electrode through a contact window in the gate insulator. These island-like regions form pn junctions at their interface with the channel and are biased by the gate voltage. An overlying layer of silicate glass extends down into the U-shaped grooves and essentially covers the gate electrode. The silicate glass layer is patterned to open contact windows above the source regions and also above that portion of the gate electrode which is disposed on the side portions of the channel layer at the principal film surface. The top of the completed device is covered with metallization in which insulating gaps are formed between the source metal, which is in low resistance electrical contact with the source regions through contact windows in the silicate glass and gate insulator layer, and the gate metal, which is in electrical contact with the gate electrode.

In operation, an electrical potential is applied across the source and drain terminals to produce a working current. The channel is extrinsically conductive and therefore a drain current flows with no applied gate voltage. The current flows vertically, passing between opposed sections of the gate electrode which extend along the sides of each bar structure. The distance between the source region and the drain region is the channel length. To control the current flowing between the source and drain, a voltage of appropriate polarity is applied to the gate electrode via the gate metal. An electric field is thereby generated which extends through the gate insulator and into the channel. The field effect produced by the opposed sections of the gate electrode creates two opposed depletion regions in that portion of the channel which is disposed in the bar structures. As the gate voltage is increased, these opposed depletion regions constrict the channel area in the bar structures, thereby increasing the channel resistance. If the gate voltage is increased such that the depletion areas meet, the current flowing between the source and drain is turned off. This is the gate pinchoff voltage. Thermally generated minority carriers generated in the depleted channel move toward the gate-channel pn junctions which are reversed biased by the gate voltage. This prevents the formation of an inversion layer of minority carriers which would otherwise counteract the gate field, preventing turn-off in high power devices. By adjusting the channel doping and the distance between opposed gate sections, a power IGFET having the desired current carrying capacity can be fabricated.

BRIEF DESCRIPTION OF THE DRAWINGS

While the novel features of the invention are set forth with particularity in the appended claims, the invention, both as to organization and content, will be better understood and appreciated from the following detailed description taken in conjunction with the drawings in which:

DETAILED DESCRIPTION OF THE PREFERRED EMBODIMENTS

Figure 1:
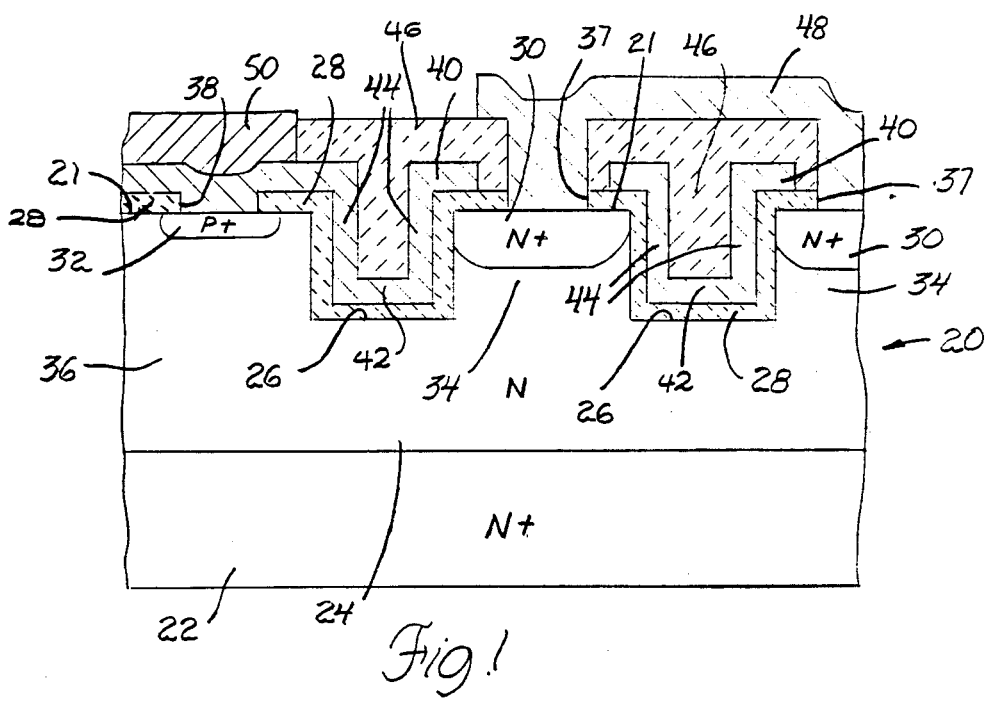
FIG. 1 is a sectional side view of a depletion mode IGFET made in accordance with this invention.
Figure 2:
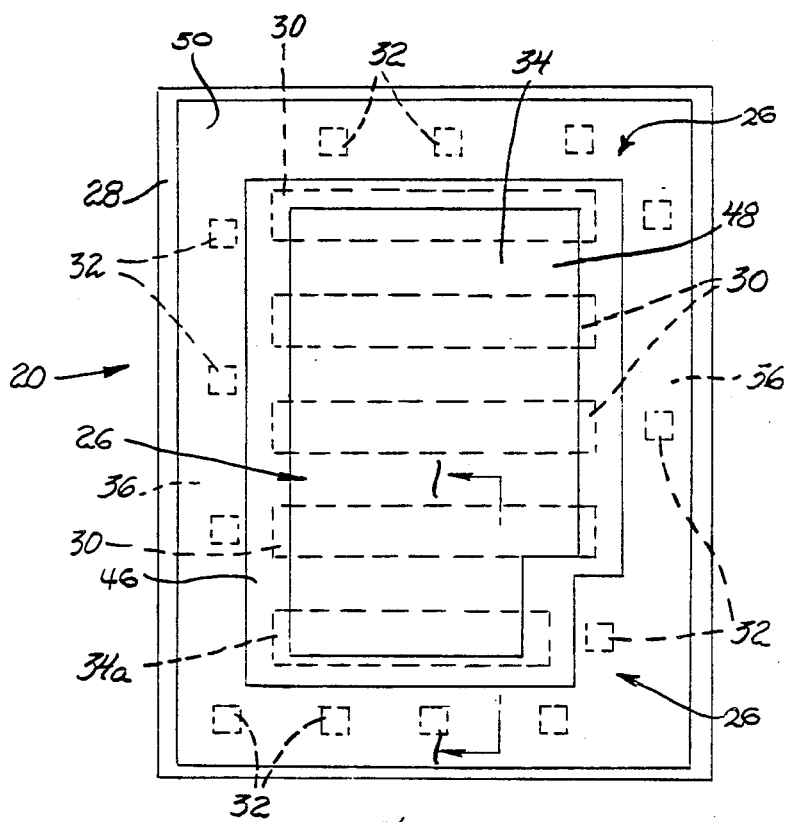
FIG. 2 is a plan view of a thin film depletion mode IGFET made in accordance with the present invention, the source contacts being shown in phantom.

FIGS. 1 and 2 illustrate a thin film depletion mode insulated gate field effect switching transistor produced in accordance with this invention. The transistor includes semiconductive film 20 having a principal surface 21. Film 20 comprises a drain region 22 of one conductivity type, for example n+-type silicon semiconductor material, and an overlying epitaxial channel layer 24 of the same conductivity type but less heavily doped material than drain 22. Although the precise dopant densities of the film regions are not critical to our invention, doping should be as uniform as with other microelectronic devices of this general nature and all materials should be of device grade purity.

U-shaped grooves 26 extend through principal surface 21 into channel layer 24 of film 20. Disposed on the principal surface 21 and extending down into the U-shaped grooves 26 is a gate insulator layer 28 which serves as a dielectric through which source regions 30 and island-like regions 32 are accessed. Source regions 30 are formed in the upper surface of bar-like structures 34 which have U-shaped grooves 26 on each side thereof and which extend across film 20. As best seen in FIG. 2, bar-like structures 34 extend between lateral channel portions 36. Bar-like structure 34a can be made shorter than the remaining structures 34 to form a larger area for the gate contact. Source regions 30 are of the same conductivity type as channel layer 24, but are more heavily doped, for example, n+-type material. Source regions 30 extend the full length of bar structures 34 immediately beneath source contact windows 37.

Figure 3:
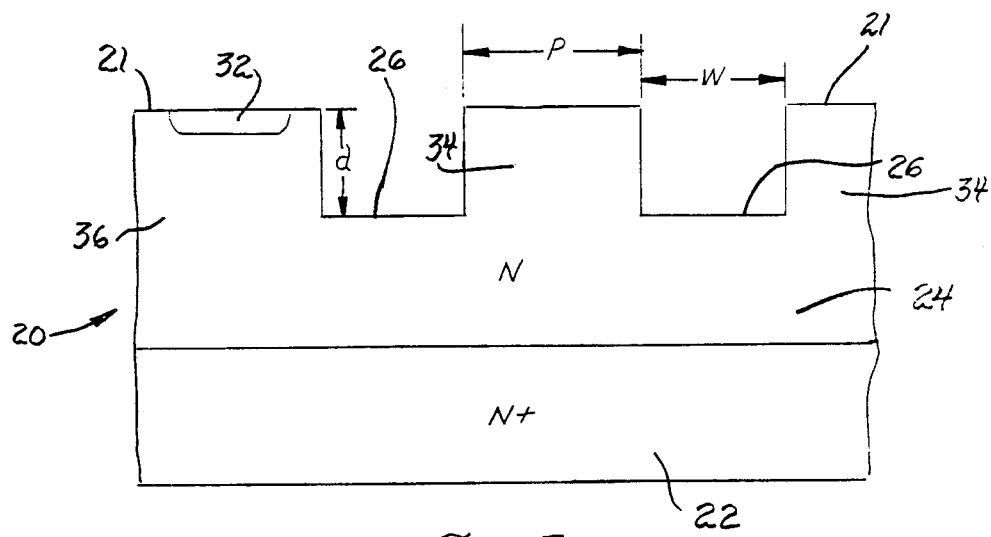
FIG. 3 is a sectional view of n/n+ semiconductor wafer after initial processing to form parallel, U-shaped grooves.

As shown in FIG. 1 and in FIG. 3 (depicting an intermediate stage of fabrication) island-like regions 32 are formed intermittently along lateral channel portions 36 and may be placed along both channel portions 36 if desired. Island-like regions 32 are disposed in film 20 at principal surface 21 beneath island contact windows 38 in gate insulator layer 28. Regions 32 are of a conductivity type opposite that of channel layer 24, and are of p-type material in this example.

Disposed on gate insulator 28 is a layer forming gate electrode 40 which extends through island contact windows 38 in electrical contact with island-like regions 32 which extend generally parallel to the path of current flow between the source region 30 and the drain region 22. Gate electrode 40 has recessed segments 42 extending down into grooves 26 with each gate segment 42 having vertical sections 44. Gate electrode 40 is patterned such that it does not cover source contact window 37. A thick layer of silicate glass 46 is disposed over gate electrode 40 filling the void in recessed gate segments 42. Glass layer 46 is patterned to expose source contact windows 37 and that portion of gate electrode 40 which is disposed on the surface of lateral channel portions 36. Source metal 48 (illustrated in phantom in FIG. 2) essentially overlies silicate glass layer 46 and is in electrical contact with source regions 30 through source contact windows 37. Gate metal 50 is disposed on the exposed portion of gate electrode 40 overlying lateral channel portions 36. A drain terminal (not shown) makes ohmic contact to drain 22.

In operation, an electrical potential is applied across source regions 30 and drain region 22. source metal 48 is in low resistance electrical contact with every source region 30 through source contact windows 37. Therefore, by attaching leads (not shown) to source metal 48 and the drain 22, a working current between source regions 30 and drain region 22 can be established. Channel layer 24 is made sufficiently conductive, for example n-type semiconductor, to conduct an electrical current with no voltage applied to the gate electrode 40. Source metal 48 is insulated from all conductive and semiconductive device structures other than source regions 30. In order to flow between source 30 and drain 22, current travels vertically through the bar-like structures 34 which are integral extensions of channel layer 24. This is the transistor on-state. In order to modulate or turn off the current, a gate potential of the appropriate polarity, for example a positive voltage in an n-channel device, is applied to gate electrode 40 by attaching a lead (not shown) to gate metal 50. It is important to note that gate electrode 40 is a single film disposed on principal surface 21 above gate insulator layer 28, which is folded into film 20 and within the grooves 26. As stated previously, gate electrode 40 has source contact windows 37 cut therein and is in electrical contact with island-like regions 32 through island contact windows 38.

As the gate voltage is increased, the gate electric field extends from recessed gate electrode segments 42, through gate insulator layer 28, into channel layer 24. The fields which extend from vertical gate electrode sections 44 form opposed depletion regions in those portions of channel layer 24 which are disposed in bar-like structures 34. These depletion regions in bar-like structures 34 constrict the available channel area through which the current between source 30 and drain 22 must flow. This raises the channel resistance and lowers the drain voltage. If the voltage applied to gate electrode 40 is increased sufficiently, a significant number of electron-hole pairs are thermally generated in channel layer 24. The minority carriers (holes in the present example) are drawn toward island-like regions 32 which form a pn junction at their interface with channel layer 24. The holes move toward this pn junction because it is reverse-biased by the potential applied to gate electrode 40 which is in electrical contact with island-like regions 32 through island contact windows 38. The elimination of minority carriers prevents their accumulation at the interface of the gate insulator 28 and channel layer 24 in bar-like structures 34. This accumulation would otherwise create an inversion layer of holes which would interfere with the gate field and prevent pinchoff. By eliminating the inversion layer, the gate voltage can be increased such that the opposed depletion regions extending from opposed vertical gate electrode sections 44 meet in channel layer 24 in bar-like structures 34 to pinch off the current between source regions 30 and drain 22. Every bar-like structure 34 must therefore have one vertical gate electrode section 44 on each side so that opposed fields are generated therein.

The distance between vertical gate electrode sections 44 as measured through bar-like structures 34 determines in part the pinchoff voltage of the device. This dimension is designated in FIG. 3 by the letter "P" and represents the pitch of each bar-like structure 34. Since our device is designed as a power transistor, the on resistance must be made as small as possible. This is achieved by increasing the channel area and channel doping. Channel area is increased by making the grooves 26 very narrow, about 2 micrometers across. This dimension is designated in FIG. 3 by the letter "w". Although it would be desirable to increase the packing density of the device even more by decreasing "w", present technology limits our ability to define grooves 26 with a w less than 1 or 2 micrometers. Three or four micrometers should be sufficient and makes it less likely that the thin films deposited in the grooves 26 will crack. We cut grooves 26 in the film 20 by reactive ion beam etching. The depth "d" of grooves 26 is not critical, however grooves 26 should be deep enough so that vertical gate electrode sections 44 are of sufficient size to create an effective electric field in bar-like structures 34 to achieve pinchoff with a reasonable gate voltage. A groove 26 depth of 3 to 4 micrometers would be sufficient.

The channel doping also determines the gate pinchoff voltage. A more heavily doped channel layer 24 requires a larger gate voltage to pinch off the current for a given bar structure pitch. We believe that a good power device would have a pinchoff of 1 to 4 micrometers, preferably 4 micrometers, and a channel doping density of from about $2 \times 10^{15}$ to $5 \times 10^{16}$ dopant atoms per cubic centimeter of channel. Of course, higher channel doping requires a smaller pitch for pinchoff at a given gate voltage.

Island-like regions 32 have a minimum depth of about 200 nanometers, a length of about 5 micrometers and a width of about 3 micrometers. It is important to note that the perimeter of each island contact window 38 is smaller than the perimeter of the island-like region 32 which it overlies. This assures that the gate electrode 40 contacts only island-like region 32 and not channel layer 24. Although there is some flexibility in the number and spacing of island-like regions 32 in channel layer 24, best results are obtained if island-like regions 32 are arranged such that no point in channel layer 24 is more than 1.0 millimeter from a pn junction.

Various fabrication sequences may be suitable and one may begin with, for example, a n/n+ epitaxial silicon wafer where the n-layer is 5-10 micrometers thick and comprises channel layer 24. The n+ portion is drain region 22. Multiple grooves 26 are cut by reactive ion beam etching into principal film surface 21 to a depth of 3 to 4 micrometers and a width of about 4 micrometers. The pitch of bar-like structures 34 defined by the grooves 26 is approximately 4 micrometers. The drain resistivity should be as low as possible, preferably around 0.001 ohm-centimeter. The channel layer resistivity can be approximately 1.0 ohm-centimeter. The array of grooves 26 could possibly be formed using other etching techniques.

Next, a layer of oxide which serves as gate insulator layer 28 is formed on the surface of film 20, as for example by heating film 20 in dry oxygen. Insulator layer 28 extends down into grooves 26. Gate insulator layer 28 should be fairly uniform in thickness, approximately 60 to 120 nanometers thick, preferably 0.1 micrometer. The thickness of insulator layer 28 is dictated by gate and drain voltage requirements. If it is too thin, it will break down prematurely. If it is too thick, it will limit the mutual transconductance of the device. Gate electrode 40 could possibly be one of several suitable materials, and in an n-type channel device, we prefer to use polysilicon highly doped with phosphorous. Using polysilicon as the gate electrode material, the thickness of gate electrode 40 should be about 1 micrometer.

Island-like regions 32 can be formed by first opening windows 38 in gate insulator layer 28 and then using the patterned oxide as an implant mask. An implant of boron ions at 50 keV in a dose of $1 \times 10^{15}$ ions per square centimeter to form $p^+$-type island-like regions 32 in a n-type channel device would be appropriate. The boron implant can then be diffused such that gate electrode 40 which extends through island contact windows 38 makes low electrical resistance contact with islandlike regions 32, as stated, wholly within their perimeters.

Gate electrode 40 can be patterned using any conventional technique such that it does not cover source regions 30. Silicate glass layer 46, which isolates gate electrode 40 from the gate and source metallization, is heated to reflow it into grooves 26 and patterned to access the gate electrode 40 and source regions 30 as shown in FIGS. 1 and 2. We prefer a phosphosilicate glass for layer 46, approximately 1.5 micrometers thick. About 3 to 4 mole percent phosphorous in the phosphosilicate glass is sufficient to lower its melting point. Source regions 30 can then be implanted by first removing a portion of gate insulator 28 above source regions 30 and then implanting, for example, phosphorous ions at 100 keV in a dose of $5 \times 10^{15}$ ions per square centimeter. The source dopant can be diffused at a relatively low temperature, for example about 900° C., to minimize any reflow of silicate glass layer 46.

Finally, a metallization layer is formed over the device surface and then patterned using standard techniques to form source metal 48 and gate metal 50, which are separated by an insulating gap.

A device fabricated in conformance with the parameters set forth herein should have a drain breakdown of approximately 50 volts and a 1 mohm-cm$^2$ specific on resistance.

Figure 4:
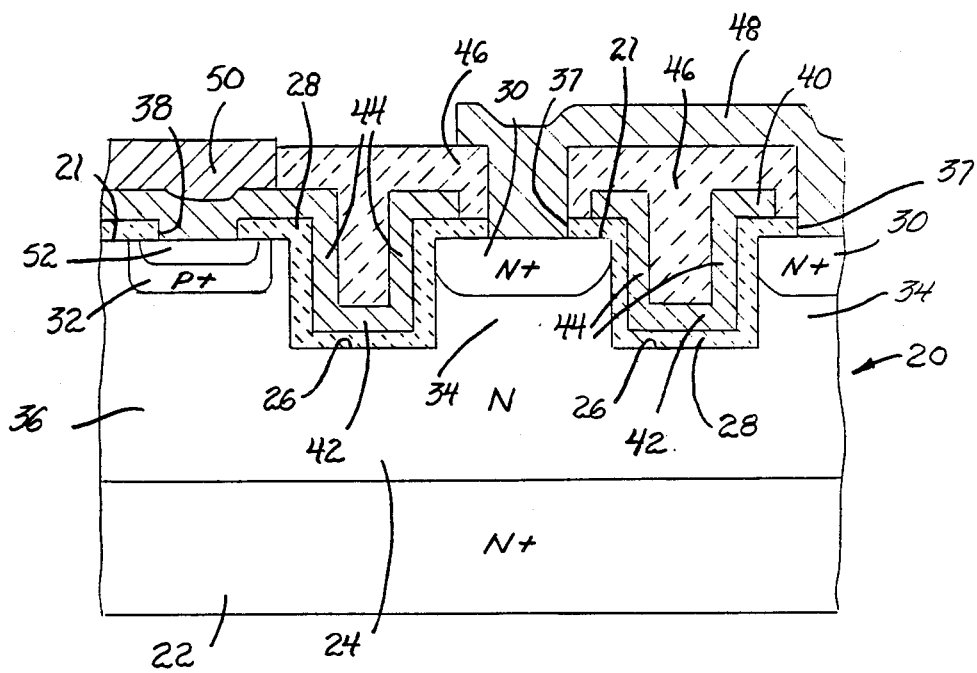
FIG. 4 depicts a sectional view of another embodiment of our invention having back-to-back pn junctions.

In another embodiment of our invention, somewhat greater channel conductivity can be achieved by operating our invention in what is known as the accumulation mode. For accumulation mode operation, a gate voltage of appropriate polarity is applied to attract majority charge carriers to the interface of channel layer 24 and gate insulator layer 28. This accumulation layer creates a conductive path which extends vertically from source region 30 down to a distance equal to the depth of grooves 26. In effect, this accumulation layer of majority current carriers conducts current in parallel with the lower region of channel layer 24. In this embodiment, we block current which would otherwise flow through gate electrode 40 across the now forward-biased pn junction at the interface of island-like regions 32 and channel layer 24 by including small island-like regions 52 in the channel layer 24, as shown in FIG. 4, within which the island-like regions 32 are wholly nested. Regions 52 have a conductivity type opposite that of island-like regions 32. In this embodiment, island contact windows 38 must be etched such that gate electrodes 40 contact only the uppermost islandlike region 52. In this way, the back-to-back junctions so formed are back-blocking for both polarities of applied voltage provided the parasitic npn transistor so formed has a sufficiently wide base.

What is claimed is:

1. An insulated gate depletion mode field effect transistor, comprising:

a channel layer of semiconductive material having an outer surface and being of a selected conductivity type;

at least one groove in said channel layer outer surface that encircles a portion of the surface and has a depth extending at least partially through the channel layer;

a source region of semiconductor material on said channel layer outer surface above said encircled portion of said channel layer and having said selected conductivity type;

a drain region layer of semiconductor material beneath said channel layer and having said selected conductivity type;

a gate region including facing first and second edge portions on said channel encircled portion of said channel layer disposed in first and second opposing sections of said encircling groove and having a third portion on said outer surface of said channel layer;

a layer of dielectric material on said channel layer in said gate region;

a gate electrode on said dielectric layer in said gate region for applying an electrical potential to said gate region, said facing first and second edge portions of said gate region being responsive to the electrical potential applied to said gate electrode for generating corresponding facing depletion regions on said channel encircled portion in which the majority charge carriers can be substantially depleted, whereby the flow of current from said source region to said drain region can be controlled by increasing the electrical potential applied to said gate electrode and thereby reduce the distance between said opposing depletion regions; and at least one island-like region of opposite conductivity type on said channel layer outer surface at least partially in said third portion of said gate region said island-like region is small in comparison with the balance of said gate region;

means for removing minority current carriers from said island-like region when said electrical potential is applied to said gate electrode, effective to enhance current pinch-off effects of said applied electrical potential in said channel encircled portion of said channel layer.

2. The insulated gate field effect transistor recited in claim 1, wherein said encircled portion of said channel layer is bar-like and said first and second edge portions are facing elongated sides of said bar-like portion.

3. The insulated gate field effect transistor recited in claim 2, wherein said means for removing minority current carriers from said opposite conductivity type region in said gate region is an electrode contacting said channel layer surface within the periphery of said opposite conductivity type region.

4. The insulated gate field effect transistor recited in claim 3, wherein said electrode is the gate electrode.

5. The insulated gate field effect transistor recited in claim 1, wherein said means for removing minority current carriers from said opposite conductivity type region in said gate region is an electrode contacting a first island-like region of said selected conductivity type nested wholly within the periphery of a second island-like region of said opposite conductivity type on said channel layer surface.

6. The insulated gate field effect transistor recited in claim 1, further comprising a layer of electrical insulation overlying said gate region, said insulation layer having a contact window therein above said source region and a layer of metal disposed over said insulation layer and extending through said window in low resistance electrical contact with said source region to allow application of an electrical potential to said source region.

7. The insulated gate field effect transistor recited in claim 5, wherein the electrode is the gate electrode.

8. The insulated gate field effect transistor recited in claim 1, including a plurality of said island-like regions, said island-like regions being spaced apart a preselected distance to prevent the accumulation of minority charge carriers adjacent said gate region which would otherwise tend to accumulate and significantly limit the penetration of the field effect on the channel region resulting from a given voltage applied to the gate electrode.

9. The insulated gate field effect transistor recited in claim 5, with said selected conductivity type region contacting said gate electrode, said first and second island-like regions providing an enhanced electrical field effect on the channel when a voltage of one polarity is applied to the gate electrode by bleeding off electrical charges which would othewise tend to accumulate at the interface of said channel portion and the dielectric layer and by blocking the flow of current through said gate electrode at its contact with said first island-like region when a voltage of another polarity is applied to the gate electrode.

10. An insulated gate field effect transistor comprising:
a semiconductor film including a drain region of a first conductivity type;
a channel region in said semiconductor film contiguous with said drain region and having said first type of conductivity, said channel region including a portion defining at least one elongated bar integral therewith;
a source region of said first conductivity type extending longitudinally through said bar;
a groove in said semiconductor film on each side of said bar and extending longitudinally therewith;
at least one island-like region of semiconductor material of a second conductivity type opposite said first conductivity type disposed in said channel region, said channel region and said island-like region defining a pn junction;
an insulating layer disposed on said semiconductor film and having a first window therein in registration with said source region and a second window therein in registration with said island-like region, at least a portion of said insulating layer extending downwardly into said groove; and
a gate electrode contacting said said island-like region and overlying said insulating layer, said gate electrode extending downwardly into said groove and including first and second opposing sections respectively on opposite sides of said bar;
whereby applying an electrical potential to said gate electrode can generate an electric field effect in said channel region that extends from said first and second opposing gate electrode sections into the bar portion of the channel region to effectively deplete said bar portion of majority current carriers, thereby impeding the flow of current between said source region and said drain region and simultaneously reverse-biasing said pn junction to enhance said electric field by drawing away minority carriers in said channel region which would otherwise interfere with said electric field effect.

11. The insulated gate field effect transistor recited in claim 10, wherein said island-like regions are spaced apart in said channel region a distance such that no point of said channel region is more than approximately 1 millimeter away from at least one island-like region.

12. The insulated gate field effect transistor recited in claim 10, wherein said gate electrode includes a portion extending through said second window and contacting said island-like region.

13. The insulated gate field effect transistor recited in claim 12, wherein said means for applying electrical potential includes a layer of metal disposed over and contacting said gate electrode portion.

14. The insulated gate field effect transistor recited in claim 10, including an additional insulating layer on said gate electrode, a first window in said additional insulating layer, and a source electrode extending through said first windows in each of said insulating layers and contacting said source region.

15. The power transistor of claim 10, wherein said grooves are substantially parallel to each other.

16. The power transistor of claim 10, including a plurality of spaced apart island-like regions of semiconductor material each having said first conductivity type, said island-like regions being at least partially disposed within said second layer of semiconductor material and being electrically connected with said gate region, said island-like regions providing an enhanced electrical effect on said second layer when voltage is applied to said gate electrode by bleeding off electrical charges at said island-like regions which charges would otherwise tend to accumulate adjacent the gate region and reduce the field effect produced by the opposing sections of said gate region.

17. The power transistor of claim 10, wherein said island-like regions are disposed around the periphery of the area of said second layer containing said grooves.

18. The power transistor of claim 17, wherein said gate electrode includes a metal layer extending around the periphery of said area and overlying said island-like regions.

19. A power transistor comprising:
a thin film of semiconductor having a principal surface;
a drain region in said semiconductor film having a selected conductivity type, said drain region being on an opposite surface of said film;
a plurality of interconnected grooves extending downwardly into said semicoductor said principal surface, said grooves completely encircling essentially parallel rectangular portions in said channel region principal surface;

a source region in each of said rectangular portions at said principal surface;

an island-like region formed in said channel region at said principal surface and having a conductivity type opposite to said selected conductivity type;

a gate electrode having opposed portions extending downwardly into adjacent parallel grooves such that said edges of rectangular portions are disposed between said gate electrode portions, within adjacent parallel grooves without making electrical contact with them, said gate electrode also having portions on said principal surface and contacting said island-like region to electrically bias said island-like region;

a layer of electrically insulating material disposed between said gate electrode and said channel region except at said island-like region to electrically isolate said gate electrode from said groove but not from said island-like region;

first means for applying an electrical potential across said source region and said drain region to create an electrical current which flows through said bar portions;

second means for applying a voltage to said gate electrode and to generate opposed electric fields which emanate from said opposed gate portions and extend into said bar portions to pinchoff the electrical current flowing between said source region and said drain region and for simultaneously biasing said island-like region to enhance said electric field by drawing off minority charge carriers through said island-like region, which charges would otherwise tend to accumulate in said bar portions and limit the depth of said electric field in edges of said bar portions for a given voltage applied to said gate electrode.

* * * * *